United States Patent [19]

Mathuni

[11] Patent Number: 5,693,182
[45] Date of Patent: Dec. 2, 1997

[54] METHOD FOR DAMAGE ETCHING THE BACK SIDE OF A SEMICONDUCTOR DISK HAVING A PROTECTED FRONT SIDE

[75] Inventor: Josef Mathuni, München, Germany

[73] Assignee: Siemens Aktiengesellschaft, Munich, Germany

[21] Appl. No.: 604,643

[22] Filed: Feb. 21, 1996

[30] Foreign Application Priority Data

Feb. 21, 1995 [DE] Germany ............ 195 05 906.9

[51] Int. Cl.$^6$ .................................. H01L 21/00
[52] U.S. Cl. .................... 156/645.1; 156/643.1; 156/659.11; 216/52; 216/67; 437/226; 437/225
[58] Field of Search ............ 156/636.1, 637.1, 156/643.1, 645.1, 659.11; 437/225, 226; 216/2, 38, 41, 52, 67, 69, 88

[56] References Cited

U.S. PATENT DOCUMENTS 4,946,547  8/1990  Palmour et al. .
5,075,256  12/1991  Wang et al. .

FOREIGN PATENT DOCUMENTS 0 182 218  5/1986  European Pat. Off. .
195 02 777  8/1995  Germany .

OTHER PUBLICATIONS

Patent Abstract of Japan No. JP 3-272140 (Otake), Dec. 3, 1991.
IEEE Publ., vol. 13, No.3, Sep. 1990, Nishiguchi et al., pp.528-533, "Mass Production Back-Grinding/Wafer-Thinning Technology for GaAs Dev."
American Institute of Physics Publ. 54 (25), 9 Jun. 1989, pp. 2553-2555, (Ohkawa et al.) "Homoepitaxial growth of ZnSe on dry-etched substrates".
Solid State Technology Publ. Oct. 1994, (Boitnott), pp. 51,52,56,58, "Downstream Plasma Processing: Consideration for selective etch and other process".
Motorla, Inc. Publ. vol. 23, Oct. 1994, (Shumate et al.), p. 8, "Silicon Wafer Thinning and Dicing Round or Non Orthogonal Die Using Dry Etching".

*Primary Examiner*—William Powell
*Attorney, Agent, or Firm*—Herbert L. Lerner; Laurence A. Greenberg

[57] ABSTRACT

A method for making large scale integrated circuits on a disklike semiconductor substrate includes grinding a disk thin enough to be able to be sawn apart into individual chips. A damage zone caused by the grinding on a back side of the wafer is removed by etching while protecting a front side of the wafer, prior to sawing. The etching is carried out in the form of a microwave or high-frequency-excited downstream plasma etching process using fluorine compounds in an etching gas.

8 Claims, 1 Drawing Sheet

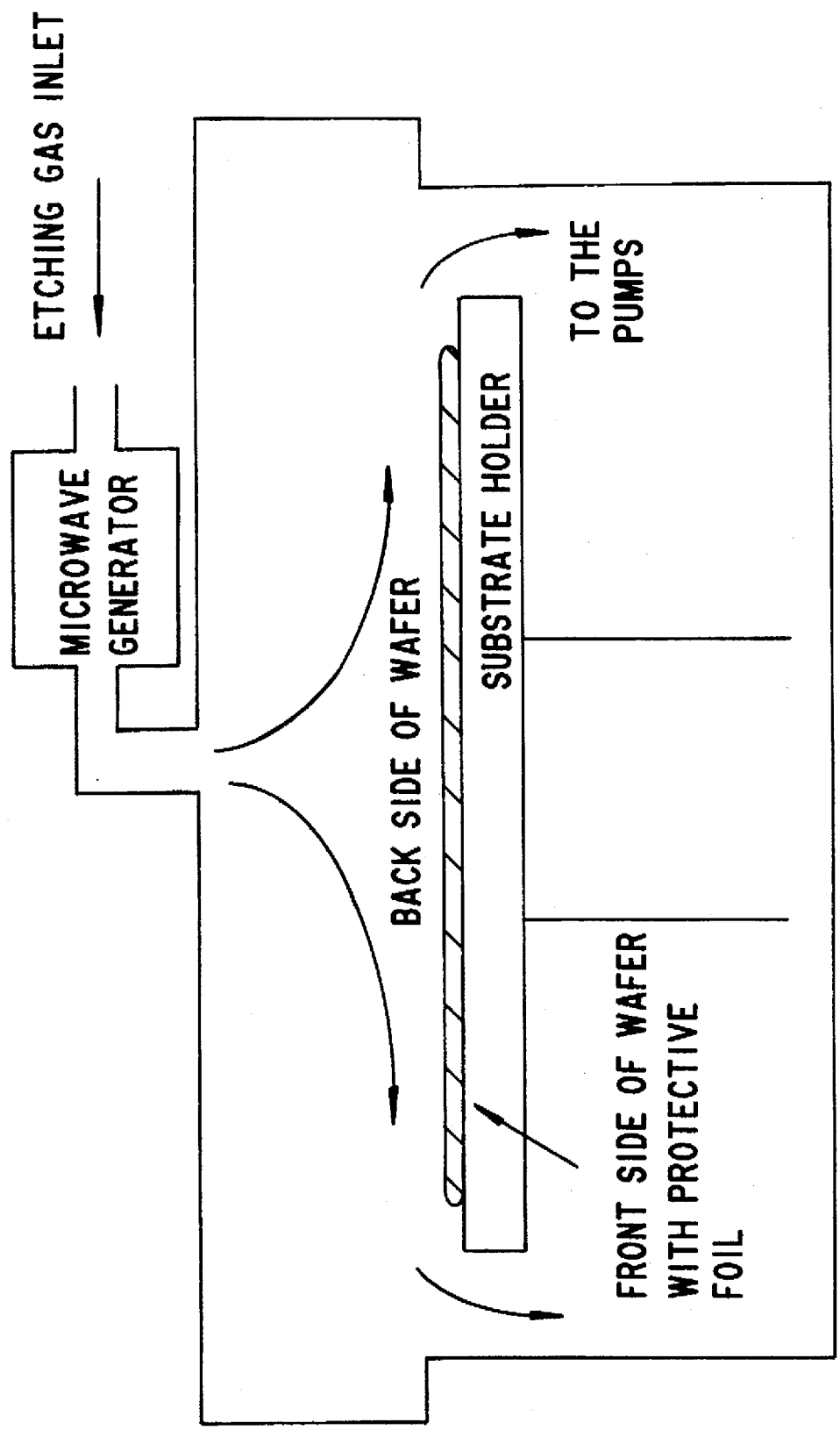

METHOD FOR DAMAGE ETCHING THE BACK SIDE OF A SEMICONDUCTOR DISK HAVING A PROTECTED FRONT SIDE

BACKGROUND OF THE INVENTION

FIELD OF THE INVENTION

The invention relates to a method for making large scale integrated circuits on a disklike semiconductor substrate, in which the disks are ground thin so that they can then be sawn apart into individual chips, and in which a damage zone caused by the grinding process on a back side of the wafer is removed again through the use of etching performed with a front side of the wafer being protected and prior to the sawing.

At an end of a manufacturing process of silicon wafers with semiconductor components, the wafers are ground thin so that they can then be sawn apart into individual chips. On the back side of the wafer, the grinding process leaves behind a destroyed silicon surface covered with fine cracks which is therefore under stress. If the wafers are ground very thin (such as <200 μm for chip card applications), then they can consequently break very easily in the ensuing sawing, or afterward. Disturbances and stresses that arise in a sawing edge from the sawing itself also play a role.

In order to prevent uncontrolled and premature breakage, the back side of the wafer has previously be etched down by several micrometers by wet etching, thus removing the stress-causing damage zone. The front side of the disk is typically protected by a thick (approximately 100 μm) foil, which must also be entirely sealed at the edge of the wafer, so that the necessity of additional lacquering of the wafers, which would otherwise have to be carried out in order to prevent destruction of peripheral chips by the wet etching, can be omitted.

However, that method has some major disadvantages: After the wet back-etching, the chemical must be flushed away again and the wafer spun-dried, which given thinly ground wafers can cause wafer breakage. Moreover, for environmental protection reasons, wet chemical processes are to be avoided as much as possible. Heretofore, there has been no method to eliminate the stresses and disturbances in the sawing edge, because wet-chemical silicon etchants would also attack unprotected aluminum pads.

SUMMARY OF THE INVENTION

It is accordingly an object of the invention to provide a method for damage etching the back side of a semiconductor disk having a front side being protected, which overcomes the hereinafore-mentioned disadvantages of the heretofore-known methods of this general type.

With the foregoing and other objects in view there is provided, in accordance with the invention, a method for making large scale integrated circuits on a disklike semiconductor substrate, which comprises grinding a disk thin enough to be able to be sawn apart into individual chips; removing a damage zone caused by the grinding on a back side of the wafer by etching while protecting a front side of the wafer, prior to sawing; and carrying out the etching in the form of a microwave or high-frequency-excited downstream plasma etching process using fluorine compounds in an etching gas.

In accordance with another mode of the invention, there is provided a method which comprises protecting the front side of the wafer with a neutral gas flowing over the front side of the wafer.

In accordance with a further mode of the invention, there is provided a method which comprises carrying out the etching up to inside of sawing edges of the wafer.

In accordance with a concomitant mode of the invention, there is provided a method which comprises carrying out the etching for an etching time of between 10 seconds and 4 minutes.

Other features which are considered as characteristic for the invention are set forth in the appended claims.

Although the invention is illustrated and described herein as embodied in a method for damage etching the back side of a semiconductor disk having a front side being protected, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE of the drawing is a diagrammatic, vertical-sectional view of an exemplary embodiment of a single-wafer etching system which is suitable for carrying out the method of the invention.

DESCRIPTION OF THE PREFERRED EMBODIMENTS

Referring now to the single FIGURE of the drawing in detail, there is seen a chamber having a substrate holder on which a front side of a wafer with a protective foil is supported. An etching gas flows through an inlet of a microwave generator and over a back side of the wafer in the chamber to pumps, in a direction indicated by curved arrows.

A first advantage of the method of the invention is that etching can be carried out with existing plasma etching equipment, such as Tokuda CDE 7, CDE 8 or Gasonics IPC. The novel method is also more inexpensive and more environmentally friendly, and moreover produces gentler treatment, in terms of mechanical strains on wafers, than wet-chemical etching.

The essential points in this respect can be seen from the drawing which illustrates a microwave version: If the front sides of the wafers are protected by a foil, then the wafer can be transported in the conventional way, face down, and etched from above. However, etching equipment in which the thinly ground wafers are mechanically gently treated is recommended. This is the case, for instance, if the etching system is constructed as an airlock system and if an entire tray can be pumped out slowly or ventilated in a feed chamber while another tray is being machined.

Various microwave and high-frequency plasma processes are already available for etching silicon on the back side of the wafer. This can be carried out either with $CF_4/O_2$ chemistry or with $NF_3$ or $SF_6/O_2/N_2$ ($N_2O$) chemistry. Heretofore, the assumption was always that several micrometers had to be removed, so that plasma etching processes appeared uneconomical, because of their long etching times. Since according to the invention the etching is carried out preferentially at damaged points or along stress lines, unlike the situation with wet etching, only a brief etching time is needed (between 10 seconds and 4 minutes, depending on the grinding process and etching chemistry, for a removal of around 200 nm), in order to take the stress from the wafers or from sawing edges. The first of these can be monitored, for instance by measuring wafer flexing. Controlled overetching finally rounds off the stress cracks at their end points, so that a requisite breaking strength is achieved.

In chemical downstream etching, which is known not to stress the wafer by electrical fields or ions because a plasma generating chamber and a specimen are separated, or in other words in which practically pure chemical etching takes place, in the manner presented, it is no longer necessary to additionally apply lacquer to the front side of the wafer to protect peripheral components. Even if these components were accessible to the etching gas because of adhesion problems of the foil, still within the aforementioned brief etching time, aluminum in the pads is not attacked at all, and a thick oxide, nitride protective film is only insignificantly attacked because of high selectivity. For this reason, the sawing edges of an unprotected chip surface could also be damage-etched by the method described.

If one wishes to dispense with the foil on the front side entirely, then one can have recourse to a method for front side protection that is described in German Published, Non-Prosecuted Patent Application DE 44 05 667 A1, which is hereby incorporated by reference. The front-side protection is carried out substantially through the use of a neutral gas flowing over it that prevents any penetration of the etching gas particles.

I claim:

1. A method for making large scale integrated circuits on a semiconductor substrate, which comprises:

grinding a wafer thin enough to be able to be sawn apart into individual chips;

removing a damage zone caused by the grinding on a back side of the wafer by etching while protecting a front side of the wafer, prior to sawing; and carrying out the etching in the form of a microwave-excited downstream plasma etching process using fluorine compounds in an etching gas.

2. The method according to claim 1, which comprises protecting the front side of the wafer with a neutral gas flowing over the front side of the wafer.

3. The method according to claim 1, which comprises carrying out the etching up to inside of sawing edges of the wafer.

4. The method according to claim 1, which comprises carrying out the etching for an etching time of between 10 seconds and 4 minutes.

5. A method for making large scale integrated circuits on a semiconductor substrate, which comprises:

grinding a wafer thin enough to be able to be sawn apart into individual chips;

removing a damage zone caused by the grinding on a back side of the wafer by etching while protecting a front side of the wafer, prior to sawing; and carrying out the etching in the form of a high-frequency-excited downstream plasma etching process using fluorine compounds in an etching gas.

6. The method according to claim 5, which comprises protecting the front side of the wafer with a neutral gas flowing over the front side of the wafer.

7. The method according to claim 5, which comprises carrying out the etching up to inside of sawing edges of the wafer.

8. The method according to claim 5, which comprises carrying out the etching for an etching time of between 10 seconds and 4 minutes.

* * * * *